(12) United States Patent
Gambee et al.

(10) Patent No.: US 10,923,478 B2
(45) Date of Patent: Feb. 16, 2021

(54) REDUCTION OF ROUGHNESS ON A SIDEWALL OF AN OPENING

(71) Applicant: Micron Technology, Inc., Boise, ID (US)

(72) Inventors: Christopher J. Gambee, Caldwell, ID (US); Devesh Dadhich Shreeram, Boise, ID (US); Irina V. Vasilyeva, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 34 days.

(21) Appl. No.: 16/258,986

(22) Filed: Jan. 28, 2019

(65) Prior Publication Data
US 2020/0243535 A1 Jul. 30, 2020

(51) Int. Cl.
*H01L 27/108* (2006.01)
*H01L 21/02* (2006.01)
*H01G 4/008* (2006.01)
*H01G 4/08* (2006.01)
*H01G 4/012* (2006.01)
*H01G 4/33* (2006.01)
*H01L 49/02* (2006.01)

(52) U.S. Cl.
CPC ....... *H01L 27/10852* (2013.01); *H01G 4/008* (2013.01); *H01G 4/012* (2013.01); *H01G 4/08* (2013.01); *H01G 4/33* (2013.01); *H01L 21/02164* (2013.01); *H01L 27/10805* (2013.01); *H01L 27/10894* (2013.01); *H01L 28/90* (2013.01)

(58) Field of Classification Search
CPC ........... H01L 27/10829; H01L 27/1085; H01L 21/02164
See application file for complete search history.

(56) References Cited

U.S. PATENT DOCUMENTS

| | | | |
|---|---|---|---|
| 5,763,306 A * | 6/1998 | Tsai ................. | H01L 27/10852 257/E21.648 |
| 7,662,693 B2 | 2/2010 | Bhattacharyya | |
| 7,875,529 B2 | 1/2011 | Forbes et al. | |
| 7,875,733 B2 | 1/2011 | Forbes et al. | |
| 8,274,777 B2 | 9/2012 | Kiehlbauch | |
| 2003/0136996 A1 * | 7/2003 | Park ....................... | H01L 28/87 257/303 |
| 2007/0178409 A1 * | 8/2007 | Chiang-Lin ........... | G03F 7/2022 430/311 |
| 2008/0020540 A1 * | 1/2008 | Takeda .............. | H01L 21/76811 438/393 |

(Continued)

*Primary Examiner* — Michele Fan
(74) *Attorney, Agent, or Firm* — Brooks, Cameron & Huebsch, PLLC

(57) ABSTRACT

Methods, apparatuses, and systems related to reduction of roughness on a sidewall of an opening are described. An example method includes forming a liner material on a first sidewall of an opening in a first silicate material and on a second sidewall of the opening in an overlying second silicate material, where the liner material is formed to a thickness that covers a roughness on the first sidewall extending into the opening. The example method further includes removing the liner material from the first sidewall of the opening and the second sidewall of the opening with a non-selective etch chemistry to reduce the roughness on the first sidewall.

18 Claims, 9 Drawing Sheets

(56) References Cited

U.S. PATENT DOCUMENTS

| | | | |
|---|---|---|---|
| 2008/0277760 A1* | 11/2008 | Kohler | H01L 21/31116 |
| | | | 257/532 |
| 2014/0159201 A1* | 6/2014 | Keller | H01L 23/5223 |
| | | | 257/532 |
| 2017/0365487 A1* | 12/2017 | Shen | C23C 16/345 |
| 2019/0035743 A1* | 1/2019 | Chang | H01L 27/10808 |
| 2019/0123040 A1* | 4/2019 | Fukahori | H01L 27/0255 |

* cited by examiner

850 ─↘

┌─────────────────────────────────────────────────────────────┐
│ FORMING A LINER MATERIAL ON A FIRST SIDEWALL OF AN OPENING  │
│ IN A FIRST SILICATE MATERIAL AND ON A SECOND SIDEWALL       │
│ OF THE OPENING IN AN OVERLYING SECOND SILICATE MATERIAL,    │—852
│ WHERE THE LINER MATERIAL IS FORMED TO A THICKNESS THAT COVERS│
│ A ROUGHNESS ON THE FIRST SIDEWALL EXTENDING INTO THE OPENING│
└─────────────────────────────────────────────────────────────┘

┌─────────────────────────────────────────────────────────────┐
│ REMOVING THE LINER MATERIAL FROM THE FIRST SIDEWALL         │
│ OF THE OPENING AND SECOND SIDEWALL OF THE OPENING           │—854
│ WITH A NON-SELECTIVE ETCH CHEMISTRY TO REDUCE               │
│ THE ROUGHNESS ON THE FIRST SIDEWALL                         │
└─────────────────────────────────────────────────────────────┘

┌─────────────────────────────────────────────────────────────┐
│ DEPOSITING A LINER MATERIAL ON A FIRST SIDEWALL OF AN OPENING│
│ IN A FIRST SILICATE MATERIAL ADJACENT AN UNDERLYING MATERIAL│—962
│ AND ON A SECOND SIDEWALL OF THE OPENING IN AN OVERLYING     │
│ SECOND SILICATE MATERIAL TO A THICKNESS THAT COVERS         │
│ A ROUGHNESS ON THE FIRST SIDEWALL EXTENDING INTO THE OPENING│
└─────────────────────────────────────────────────────────────┘

┌─────────────────────────────────────────────────────────────┐
│ ETCHING THE LINER MATERIAL AND THE ROUGHNESS ON THE FIRST SIDEWALL│
│ UTILIZING A NON-SELECTIVE ETCH CHEMISTRY, UNTIL THE LINER MATERIAL│—964
│ IS REMOVED FROM THE FIRST AND SECOND SIDEWALLS OF THE OPENING,│
│ TO REDUCE THE ROUGHNESS ON THE FIRST SIDEWALL               │
└─────────────────────────────────────────────────────────────┘

*Fig. 9*

REDUCTION OF ROUGHNESS ON A SIDEWALL OF AN OPENING

TECHNICAL FIELD

The present disclosure relates generally to semiconductor devices and methods, and more particularly to reduction of roughness on a sidewall of an opening.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), static random access memory (SRAM), synchronous dynamic random access memory (SDRAM), ferroelectric random access memory (FeRAM), magnetic random access memory (MRAM), resistive random access memory (ReRAM), and flash memory, among others. Some types of memory devices may be non-volatile memory (e.g., ReRAM) and may be used for a wide range of electronic applications in need of high memory densities, high reliability, and low power consumption. Volatile memory cells (e.g., DRAM cells) require power to retain their stored data state (e.g., via a refresh process), as opposed to non-volatile memory cells (e.g., flash memory cells), which retain their stored state in the absence of power. However, various volatile memory cells, such as DRAM cells may be operated (e.g., programmed, read, erased, etc.) faster than various non-volatile memory cells, such as flash memory cells.

BRIEF DESCRIPTION OF THE DRAWINGS

FIGS. 8-10 are flow diagrams of example methods for reduction of roughness on a sidewall of an opening in accordance with a number of embodiments of the present disclosure.

DETAILED DESCRIPTION

Figure 1:
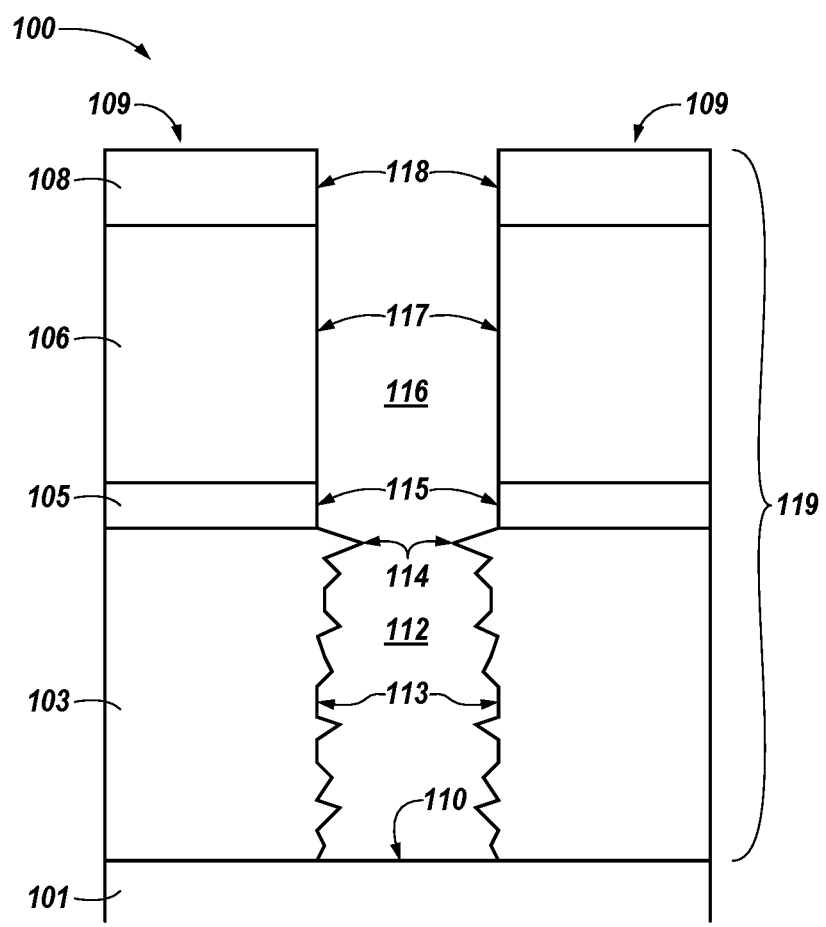
FIGS. 1-4 illustrate cross-sectional views of a portion of an example memory device at various points in time in an example fabrication sequence for reduction of roughness on a sidewall of an opening in accordance with a number of embodiments of the present disclosure.

Various types of memory devices (e.g., those that include volatile or non-volatile memory cells) may include rectilinear trenches and/or round, square, oblong, etc., cavities that may be formed into a sidewall structural material as openings. Such openings may contain, or be associated with, various materials that contribute to data access, storage, and/or processing, or to various support structures, on the memory device.

Formation of such an opening may result in roughness (e.g., line width roughness (LWR) and/or space width roughness (SWR)) on at least a portion of a sidewall of the opening. For example, formation of the opening into the sidewall structural material may, in a number of embodiments, be performed using an etching process that is selective to a number of chemical compounds in the sidewall structural material. One or more of the chemical compounds may have a resistance to the etching process that is higher than that of the other chemical compounds in the sidewall structural material. For example, a chemical compound having a higher resistance to a particular selective etch chemistry may have a lower etch rate than another chemical compound having a lower resistance, and a higher etch rate, to the particular selective etch chemistry. Accordingly, the higher etch resistance of the one or more of the chemical compounds may result in remaining portions of such chemical compounds contributing to a roughness on the sidewall of the opening that extends into the cavity of the opening.

Such roughness, if not reduced (e.g., removed), may contribute to unintended consequences related to the data access, storage, and/or processing functions of the memory device. For example, as described further herein, a capacitor formed in association with the opening may have a structural feature (e.g., an electrode material) formed on the sidewall of the opening. The roughness remaining on the sidewall of the opening may contribute to an uneven (e.g., thinner) thickness at a number of positions on the structural feature formed on the sidewall. The uneven thickness, if not reduced (e.g., prevented), may increase a probability of a short circuit fault during subsequent use of the capacitor on a memory device.

The present disclosure includes methods, apparatuses, and systems related to reduction of roughness on a sidewall of an opening. An example of a method described herein includes forming a liner material on a first sidewall of an opening in a first silicate material and on a second sidewall of the opening in an overlying second silicate material, where the liner material is formed to a thickness that covers a roughness on the first sidewall extending into the opening. The example method further includes removing the liner material from the first sidewall of the opening and the second sidewall of the opening with a non-selective etch chemistry to reduce the roughness on the first sidewall.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, "a number of" something can refer to one or more such things. For example, a number of capacitors can refer to at least one capacitor.

The figures herein follow a numbering convention in which the first digit or digits correspond to the figure number of the drawing and the remaining digits identify an element or component in the drawing. Similar elements or components between different figures may be identified by the use of similar digits. For example, reference numeral 119 may reference element "19" in FIG. 1, and a similar element may be referenced as 619 in FIG. 6. In some instances, a plurality of similar, but functionally and/or structurally distinguishable, elements or components in the same figure or in different figures may be referenced sequentially with the same element number (e.g., 519-1 and 519-2 in FIG. 5).

FIG. 1 illustrates a cross-sectional view of a portion of an example memory device at a point 100 in time in an example semiconductor fabrication sequence for reduction of roughness on a sidewall of an opening in accordance with a number of embodiments of the present disclosure. The fabrication sequence illustrated in FIG. 1 is shown at a point 100 in time that corresponds to various processing activities already having been performed in the fabrication sequence.

A first silicate material 103 is shown to have been formed on an underlying substrate material 101. The substrate material 101 may be formed from various undoped or doped materials on which memory device materials may be fabricated. Examples of a relatively inert undoped substrate material 101 may include monocrystalline silicon (monosilicon), polycrystalline silicon (polysilicon), and amorphous silicon, among other possibilities.

The first silicate material 103 may, in a number of embodiments, have been formed from a borophosphosilicate glass (BPSG). The BPSG may include a silicon containing compound doped with various concentrations and/or ratios of a boron containing compound and a phosphorus containing compound. The silicon (S) containing compound may be silicon dioxide ($SiO_2$), which may be formed by oxidation of silane ($SiH_4$), among other possibilities. The boron (B) containing compound may be diboron trioxide ($B_2O_3$), which may be formed by oxidation of diborane ($B_2H_6$), among other possibilities. The phosphorus (P) containing compound may be diphosphorus pentoxide ($P_2O_5$), which may be formed by oxidation of phosphine ($PH_3$), among other possibilities. The S, B, and P containing compounds of the BPSG may include various isotopes of S, B, and P, as determined to be appropriate for functionality, formation, and/or removal of the first silicate material 103, as described herein.

The first silicate material 103 may be originally formed (e.g., deposited) as a single layer on a surface 110 of the underlying substrate material 101. For example, the first silicate material 103 may be formed without an opening 112 formed therein from an upper surface of the first silicate material 103 to the surface 110 of the underlying substrate material 101. The single layer of the first silicate material 103 may, in a number of embodiments, be deposited to a thickness in a range of from around 400 nanometers (nm) to around 750 nm above the surface 110 of the underlying substrate material 101.

A first nitride material 105 is shown to have been formed on a surface of the first silicate material 103 opposite from the underlying substrate material 101. The first nitride material 105 may be formed (e.g., deposited) as a single layer on an upper surface of the first silicate material 103. Alternatively, the first nitride material 105 may be formed (e.g., deposited) as two separate portions (e.g., layers) on the upper surface of the first silicate material 103. For example, the first silicate material 103 may be formed with an opening formed therein from an upper surface of the first nitride material 105 to an upper surface of the first silicate material 103.

The first nitride material 105 may be formed from a nitride material selected for dielectric or resistance properties. For example, one or more dielectric and/or resistor nitrides may be selected from boron nitride (BN), silicon nitride (SiNx, $Si_3N_4$), aluminum nitride (AlN), gallium nitride (GN), tantalum nitride (TaN, $Ta_2N$), titanium nitride (TiN, $Ti_2N$), and tungsten nitride (WN, $W_2N$, $WN_2$), among other possibilities, for formation of the first nitride material 105. The first nitride material 105 may, in a number of embodiments, be deposited to a thickness in a range of from around 15 nm to around 30 nm above the surface of the first silicate material 103.

A second silicate material 106 is shown to have been formed on a surface of the first nitride material 105 opposite from the first silicate material 103. The second silicate material 106 may, in a number of embodiments, be formed from tetraethyl orthosilicate ($Si(OC_2H_5)_4$), which is also referred to as TEOS. TEOS may be formed as an ethyl ester of orthosilicic acid ($Si(OH)_4$), among other possibilities.

As shown in FIG. 1, the second silicate material 106 may be originally formed (e.g., deposited) as two separate portions (e.g., layers) on the surface of the first nitride material 105 opposite from the first silicate material 103. For example, the second silicate material 106 may be formed with a second portion 116 of an opening 119 formed therein from an upper surface of the second silicate material 106 to an upper surface of the first nitride material 105 or to an upper surface of the first silicate material 103. As a consequence of deposition characteristics of TEOS and a selected etch process, a second sidewall 117 of the second portion 116 of the opening 119 may be formed smoothly. For example, both sidewalls of a trench or a continuous sidewall of a cylindrical opening, among other possible configurations, may be formed without notable roughness, as described herein, extending into an interior of the second portion 116 of the opening 119. In addition, in a number of embodiments, the sidewalls of the trench may be deposited to have a substantially constant width or the continuous sidewall of the cylindrical opening may be deposited to have a substantially constant diameter from a top to a bottom of the second portion 116 of the opening 119 in the second silicate material 106. The two separate portions of the second silicate material 106 may, in a number of embodiments, be deposited to a thickness in a range of from around 300 nanometers (nm) to around 600 nm above the surface of the first nitride material 105.

A second nitride material 108 is shown to have been formed on a surface of the second silicate material 106 opposite from first nitride material 105. The second nitride material 108 may be formed (e.g., deposited) as a single layer on an upper surface of the second silicate material 106. Alternatively, the second nitride material 108 may be formed (e.g., deposited) as two separate portions (e.g., layers) on the two separate upper surfaces of the portions of second silicate material 106. For example, the second nitride material 108 may be formed with an opening formed therein from an upper surface 109 of the second nitride material 108 to an upper surface of the second silicate material 106.

Similar to the first nitride material 105, the second nitride material 108 may be formed from a nitride material selected for dielectric or resistance properties. For example, one or more dielectric and/or resistor nitrides may be selected from BN, SiNx, $Si_3N_4$, AlN, GN, TaN, $Ta_2N$, TiN, $Ti_2N$), and WN, $W_2N$, $WN_2$, among other possibilities, for formation of the second nitride material 108. In various embodiments, the first nitride material 105 and the second nitride material 108 may be formed from a same single nitride or a same mixture of nitrides or the first and second nitride materials 105, 108 each may be formed from a different single nitride or a different mixture of nitrides dependent upon, for example, various uses to which the nitrides may be applied. The second nitride material 108 may, in a number of embodiments, be deposited to a thickness in a range of from around 80 nm to around 150 nm above the surface of the second silicate material 106.

The second portion 116 of the opening 119 may be formed through the first nitride material 105, the second silicate material 106, and the second nitride material 108. The second portion 116 may have a width or a diameter in a range of from around 20 nm to around 60 nm.

An etch process (e.g., a first wet etch process or dry etch process) may be utilized to etch via (e.g., through) the already formed second portion 116 of the opening 119 into the first silicate material 103 to form a first portion 112 of the opening 119. Performance of the etch process may result in formation of a combination of the first portion 112 and the second portion 116 in order to form a resultant opening 119 that extends from the upper surface 109 of the second nitride material 108 to the surface 110 of the substrate material 101. The resultant opening 119 may have a height in a range of from around 800 nm to around 1,500 nm.

The width or diameter of the second portion 116 being in a range of from around 20-60 nm and the height of the resultant opening 119 being in a range of from around 800-1500 nm may result in an aspect ratio (AR) of the height to width being in a range of from around 25:1 to around 50:1 as the etch progresses through the first silicate material 103 and approaches the substrate material 101. Such a high AR may contribute to the selected etch process (e.g., the etch chemistry, plasma formation, velocity of plasma projection, etc.) forming a taper (not shown) of the opening 119 in the first silicate material 103. The taper may cause a diameter of the opening 119 to decrease (e.g., progressively decrease) as the etch progresses toward the substrate material 101.

Another etch process (e.g., a second wet etch process or dry etch process) may subsequently be utilized to etch the taper of the first portion 112 of the opening 119 to conform to the width or diameter of the second portion 116 previously formed in the overlying second silicate material 106. For example, an aqueous, semi-aqueous, vapor, or plasma hydrogen fluoride (HF) based etch chemistry (e.g., an etch chemistry using just HF, a low HF and high hydrochloric acid (HCl) based etch chemistry, a high HF and low HCl based etch chemistry, or a substantially equal HF and HCl based etch chemistry, among other possibilities) or an aqueous, semi-aqueous, vapor, or plasma ammonium hydroxide ($NH_4OH$) based etch chemistry, among other possible etch chemistries, may be utilized in the second etch process in order to reduce (e.g., remove) the taper in the first portion 112 to conform to the width or diameter of the second portion 116.

The second etch process may have a selectivity for removal of a chemical compound of a plurality of chemical compounds that form the first silicate material 103 on an exposed surface of a first sidewall 113 of the first silicate material 103 (e.g., as opposed to the first silicate material 103 having a liner material 221 formed on its surface, as described in connection with FIG. 2 and elsewhere herein). For example, utilizing the HF based etch chemistry may be selective (e.g., preferential) for removal, from the first sidewall 113, of the silicon and phosphorus compounds of the BPSG from which the first silicate material 103 may be formed. Selective removal of the silicon and phosphorus compounds (e.g., etching these compounds at a higher rate) may, for example, result in at least some of the boron and/or boron compound of the BPSG remaining on the first sidewall 113 of the first portion 112 of the opening 119 as roughness (e.g., as shown at 114) at a number of positions.

A support structure may be formed for the second silicate material 106 stacked on the first silicate material 103 adjacent the substrate material 101. The support structure may, in a number of embodiments, be formed by forming (e.g., depositing) the first nitride material 105 between the first silicate material 103 and the second silicate material 106 and forming the second nitride material 108 on an opposite surface of the second silicate material 106. The first and second nitride materials 105, 108 may form the support structure by extending between and connecting (e.g., attaching) to features associated with multiple capacitors (e.g., as shown and described in connection with FIGS. 5-7) or other structural elements of the example memory device. A support structure formed as such may enable a stack of the first and the second silicate materials 103, 106 to be maintained in a more static configuration relative to each other and the underlying substrate material 101 than provided by the first and the second silicate materials 103, 106 themselves.

Figure 2:
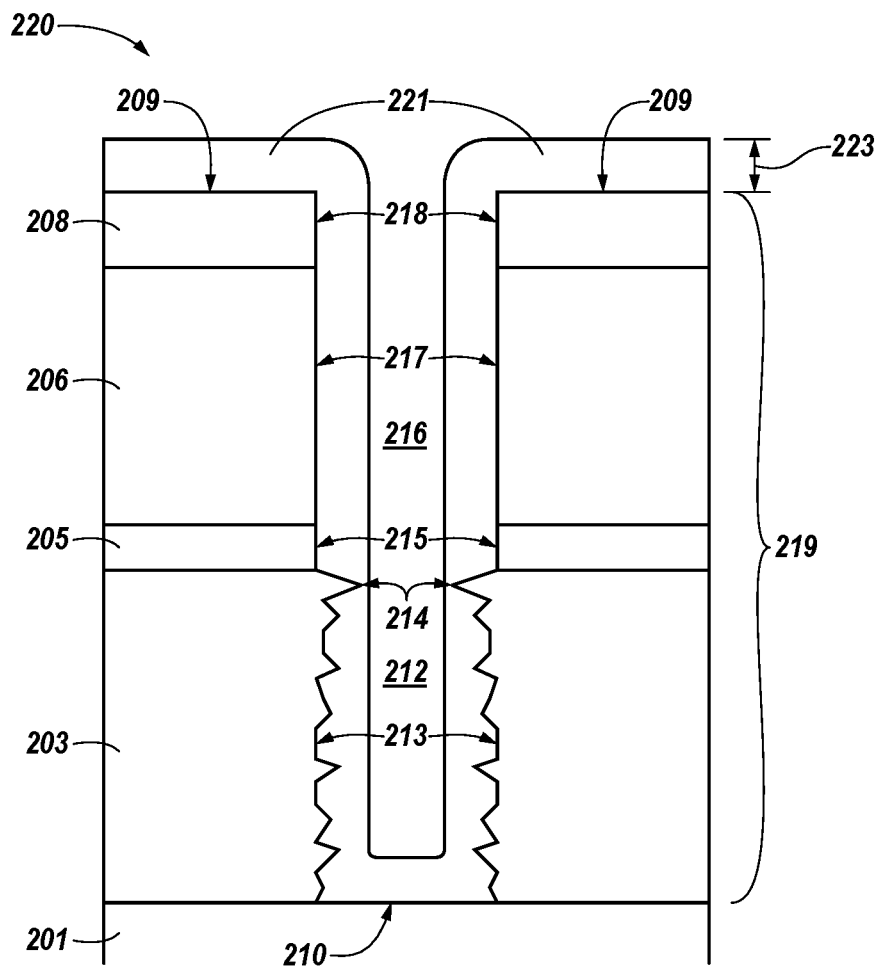

FIG. 2 illustrates a cross-sectional view of the portion of the example memory device at another point 220 in time in the example fabrication sequence described in connection with FIG. 1 in accordance with a number of embodiments of the present disclosure.

The point 220 in time of the fabrication sequence illustrated in FIG. 2 shows that a liner material 221 has been formed on the upper surface 209 of the second nitride material 208. The liner material 221 also is shown in connection with the second portion 216 of the opening 219 as being formed on a sidewall 218 of the second nitride material 208, a second sidewall 217 of the second silicate material 206, and a sidewall 215 of the first nitride material 205. The liner material 221 also is shown in connection with the first portion 212 of the opening 219 as being formed on a first sidewall 213 of the first silicate material 203 and the upper surface 210 of the substrate material 201.

The liner material 221 may, in a number of embodiments, be a non-conformal liner material deposited on the first sidewall 213 of the first portion 212 of the opening 219 in the first silicate material 203 to cover the roughness 214 on the first sidewall 213. Such a non-conformal liner material may be utilized so that a thickness or an outer surface contour of the liner material 221 tends not to follow a contour of the roughness 214 on the first sidewall 213 of the first portion 212.

The liner material 221 may, in a number of embodiments, be formed as silicon oxide based materials. For example, a silicon oxide based material may be selected from SiO and $SiO_2$ combined with hydrogen (H), nitrogen (N), carbon (C), and/or other non-metals. The other non-metals may, in a number of embodiments, include B containing compounds (e.g., $B_2O_3$, $B_2H_6$, among other possibilities), P containing compounds (e.g., $P_2O_5$, $PH_3$, among other possibilities), and/or a number of other non-metallic compounds. As such, the liner material 221 may be formed from, or to include, undoped silicon oxide (SiO and/or $SiO_2$), B doped silicon oxide, P doped silicon oxide, low B and high P doped silicon oxide, high B and low P doped silicon oxide, substantially equally B and P doped silicon oxide, and/or silicon oxide doped with various other elements and compounds. Such doped liner materials may include borosilicate glass (BSG), phosphosilicate glass (PSG), and BPSG, among other possible liner materials.

The chemistry of the silicon oxide based material selected for use as the liner material 221 may, in a number of embodiments, be tuned such that a selected etch chemistry is non-selective to the silicon oxide based liner material 221, the second silicate material 206 (e.g., the TEOS material), and the first silicate material 203 (e.g., the remaining S, B, and/or P containing compounds of the BPSG material that form the roughness 214 on the first sidewall 213). The non-selective etch chemistry also may be non-selective to etching the first nitride material 205 and the second nitride material 208 relative to the other materials. For example, the roughness 214 on the first sidewall 213 may result from a portion of the B and/or the B containing compound remaining after performance of the second etch process to remove the taper, as previously described. Hence, the liner material 221 may be selected to include B and/or a B containing compound such that the selected etch chemistry is non-selective to the silicon oxide based liner material 221 (e.g., BSG or BPSG, among other possibilities) and the B containing roughness 214 on the first sidewall 213. Alternatively or in addition, the etch chemistry selected for use on a selected liner material 221 may be tuned such that the etch chemistry is non-selective to the silicon oxide based liner material 221, the second silicate material 206, and the remaining S, B, and/or P containing compounds of the first silicate material 203 that form the roughness 214 on the first sidewall 213.

In either embodiment, the non-selective etch chemistry may have an etch rate for the roughness 214 on the first sidewall 213 that is substantially the same as (e.g., equal to) the etch rate for the selected silicon oxide based liner material 221. Hence, etching to remove most (e.g., all) of the selected silicon oxide based liner material 221 from the first sidewall 213 and the second sidewall 217 also may remove most (e.g., all) of the roughness 214 on the first sidewall 213.

In various embodiments, the non-selective etch chemistry may be selected from an aqueous etch chemistry, a semi-aqueous etch chemistry, a vapor etch chemistry, or a plasma etch chemistry. For example, the etch chemistries may be selected from an aqueous, semi-aqueous, vapor, or plasma HF based etch chemistry (e.g., an etch chemistry using just HF, a low HF and high HCl based etch chemistry, a high HF and low HCl based etch chemistry, or a substantially equal HF and HCl based etch chemistry, among other possibilities) and an aqueous, semi-aqueous, vapor, or plasma NH$_4$OH based etch chemistry, among other possible non-selective etch chemistries.

The liner material 221 may be formed (e.g., deposited) to a thickness 223 that covers the roughness 214 on the first sidewall 213 of the first silicate material 203. There may be multiple locations on the first sidewall 213 where roughness 214, as described herein, may exist following performance of the second etch process described in connection with FIG. 1. The thickness 223 of the liner material 221 to deposit on the first and second sidewalls 213, 217 of the opening 219 in order to cover the roughness 214 may be based on (e.g., determined by) a probable distance that the roughness extends into the first portion 212 of the opening 219. The probable distance may refer to a location on the first sidewall 213 of the first portion 212 at which the roughness extends further into an interior space of the first portion 212 than other potential locations where the roughness may be positioned. For example, as shown in FIG. 1, the roughness shown at the position indicated by reference numeral 114 extends from first sidewall 113 further into the interior space of the first portion 112 of the opening 119 than other shown indications of the roughness. As shown in FIG. 2, the liner material 221 is deposited to the thickness 223 that covers the roughness 214 that extends furthest from the first sidewall 213 of the first silicate material 203. The width or diameter of first portion 212 and the second portion 216 of the opening 219 is shown to be temporarily reduced by formation of the liner material 221 thereon at the point 220 in time.

The probable distance that the roughness extends furthest into the first portion 212 of the opening 219 may be based on measurements of such distances using particular first silicate materials 203, etch chemistries, etch processes, aspect ratios, etc. The measurements of such distances may be determined by tests performed prior to performance of the fabrication sequence described herein or by determination (e.g., measurement) of such distances performed during the fabrication sequence, among other possibilities. Accordingly, the liner material 221 may, in a number of embodiments, be deposited to a thickness 223 of 1-3 nm to cover the roughness 214 that extends furthest from the first sidewall 213.

Figure 3:
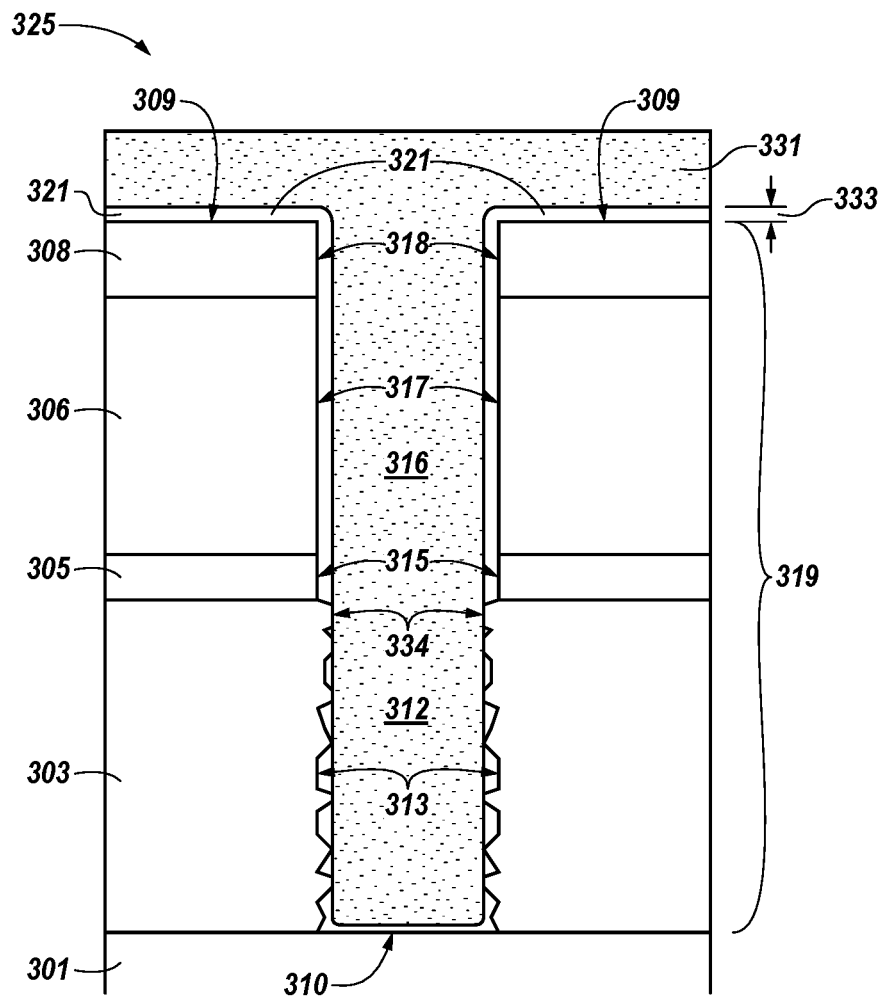

FIG. 3 illustrates a cross-sectional view of the portion of the example memory device at another point 325 in time in the example fabrication sequence described in connection with FIGS. 1 and 2 in accordance with a number of embodiments of the present disclosure.

FIG. 3 illustrates another etch process 331 (e.g., a third wet etch process or dry etch process) being performed. The third etch process 331 may include utilizing a non-selective etch chemistry. The third etch process 331 may further include etching the liner material 321 and the roughness 334 on the first silicate material 303 utilizing the non-selective etch chemistry. The non-selective etch chemistry may, in a number of embodiments, be non-selective (e.g., not having an etching ability preferential) to the liner material 321 (e.g., the silicon oxide material), the second silicate material 306 (e.g., the TEOS material), and the first silicate material 303 (e.g., the silicon, boron, and phosphorus compounds of the BPSG material). The non-selective etch chemistry also may be non-selective to etching the first nitride material 305 and the second nitride material 308. By way of example and not by way of limitation, such non-selective etch chemistries may include utilizing the HF based etch chemistries described herein.

Performance of the third etch process 331 may result in a progressive reduction in thickness 333 of the liner material 321. The reduction in thickness 333 may result from non-selective removal (e.g., etching) of the liner material 321 from the upper surface 309 of the second nitride material 308, the sidewall 318 of the second nitride material 308, the second sidewall 317 of the second silicate material 306, the sidewall 315 of the first nitride material 305, the first sidewall 313 of the first silicate material 303, and the surface 310 of the underlying substrate material 301. The non-selective reduction in the thickness 333 of the liner material 321 also may simultaneously result in (e.g., cause) a progressive reduction of the roughness 334 on the first sidewall 313 of the first silicate material 303.

Figure 4:
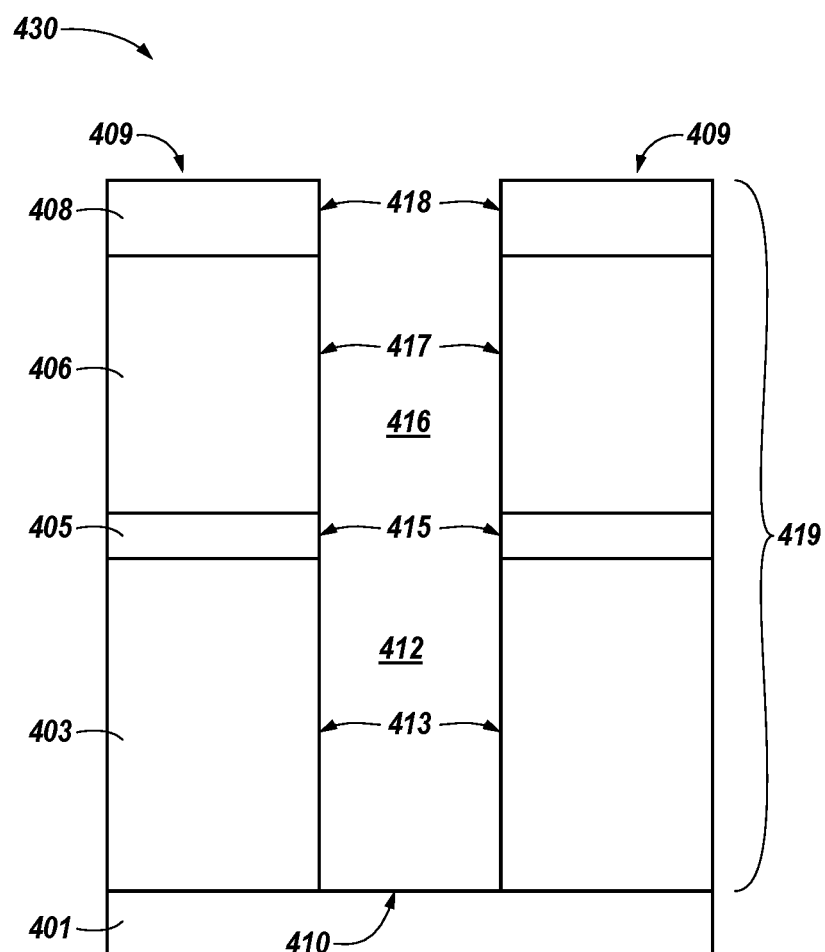

FIG. 4 illustrates a cross-sectional view of the portion of the example memory device at another point 430 in time in the example fabrication sequence described in connection with FIGS. 1-3 in accordance with a number of embodiments of the present disclosure. FIG. 4 illustrates a structure of the portion of the example memory device at a point 430 in time following completion of the third etch process 331 described in connection with FIG. 3.

Completion of the third etch process 331 utilizing the non-selective etch chemistry may include (e.g., cause) etching the liner material 321 on the first and second sidewalls 413, 417 of the first and the second portions 412, 416 of the opening 419 until the liner material 321 is removed from the sidewalls and the roughness 334 on the first portion 412 of the opening 419 is reduced (e.g., removed). Completion of the third etch process 331 also may include removal of the liner material 321 from the sidewalls 415, 418 of the first and second nitride materials 415, 418 such that the sidewalls 415, 418 are substantially coplanar with the first and second sidewalls 413, 417 of the first and the second portions 412, 416 of the opening 419. Completion of the third etch process 331 resulting in reduction of the roughness 334 may result in the width or diameter of the first portion 412 and the second portion 412 being substantially the same along the height of the opening 419. The first and second sidewalls 413, 417 of the first and the second portions 412, 416 thus may be substantially coplanar along the height of the opening 419.

Figure 5:
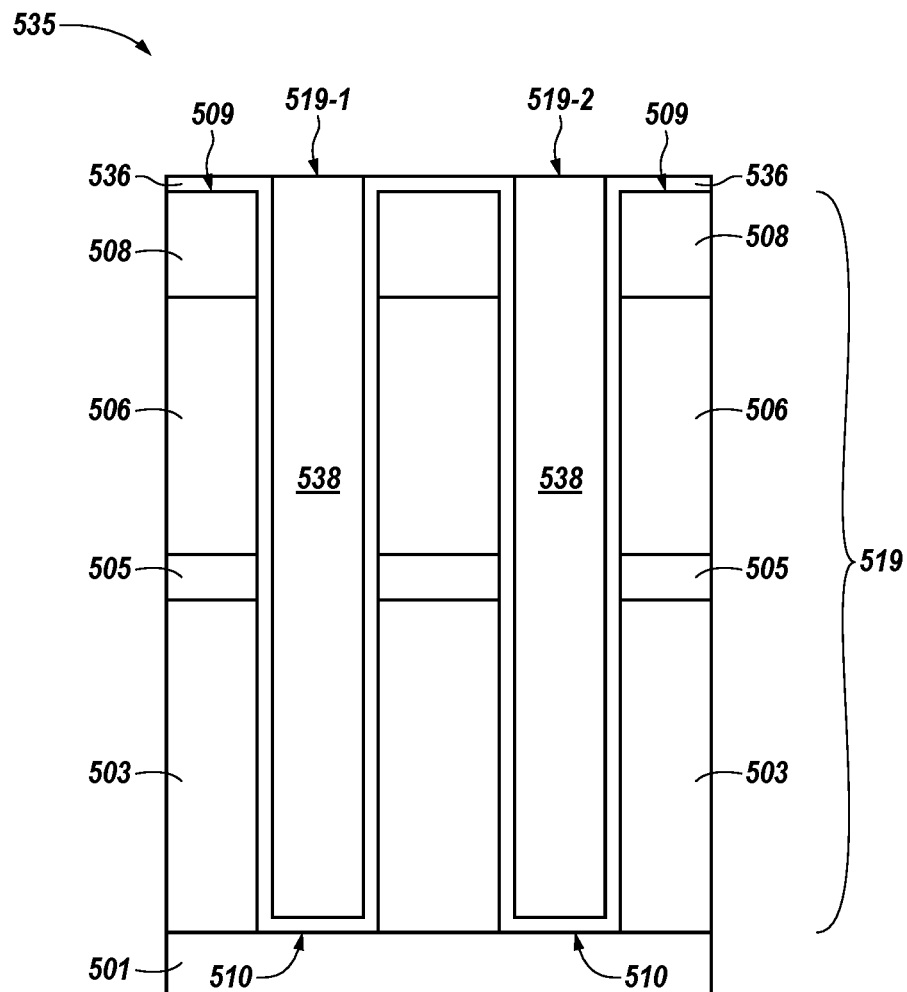
FIGS. 5-7 illustrate cross-sectional views of a portion of an example memory device at various points in time in an example fabrication sequence for formation of a capacitor in association with an opening in accordance with a number of embodiments of the present disclosure.

FIG. 5 illustrates a cross-sectional view of a portion of an example memory device at a point 535 in time in an example fabrication sequence for formation of a capacitor in association with an opening in accordance with a number of embodiments of the present disclosure. FIG. 5 illustrates a structure of the portion of the example memory device at a point 535 in time following completion of the fabrication sequence described in connection with FIGS. 1-4.

As described in connection with FIG. 1-4, a first nitride material 505 may be formed (e.g., deposited) between the first silicate material 503 and the second silicate material 506. A second nitride material 508 also may be formed (e.g., deposited) on a first surface of the second silicate material 506 opposite from a second surface on which the first nitride material 505 is formed. The opening 519 may extend from the substrate material 501 and may include a sidewall formed collectively from the sidewalls 413, 415, 417, and 418 of the respective first silicate material 503, the first nitride material 505, the second silicate material 506, and the second nitride material 508. For clarity in the example fabrication sequence, FIG. 5 shows a first opening 519-1 and a second opening 519-2 in the portion of the example memory device, although embodiments are not limited to two openings and may include any number of such openings.

As shown in FIG. 5 at point 535 in time, a first electrode material 536 has been formed (e.g., deposited) on the substrate material 510 and on the sidewalls of the openings 519-1, 519-2. In a number of embodiments, the first electrode material 536 also may have been formed on the upper surface 509 of the second nitride material 508. At point 535, a capacitor material 538 is shown as having been formed (e.g., deposited) to fill the openings 519-1, 519-2 from the substrate material 510 to a height of the opening 519 at the upper surface 509 of the second nitride material 508. In a number of embodiments, the capacitor material 538 may be deposited to fill the openings 519-1, 519-2 to an upper surface of the first electrode material 536. The first electrode material 536 and the capacitor material 538 may be formed from any conductive materials and to any width (e.g., thickness) usable in association with formation of an operable capacitor for a semiconductor device. The reduction (e.g., removal) of the roughness 214, 334 illustrated in FIGS. 2-4 may result in (e.g., cause) reduction of a probability of a short circuit fault of a capacitor (e.g., as shown at 748 and described in connection with FIG. 7) formed from the capacitor material 538 by reduction of the roughness on the first portion 412 of the openings 519-1, 519-2 on which the first electrode material 536 is formed.

Figure 6:
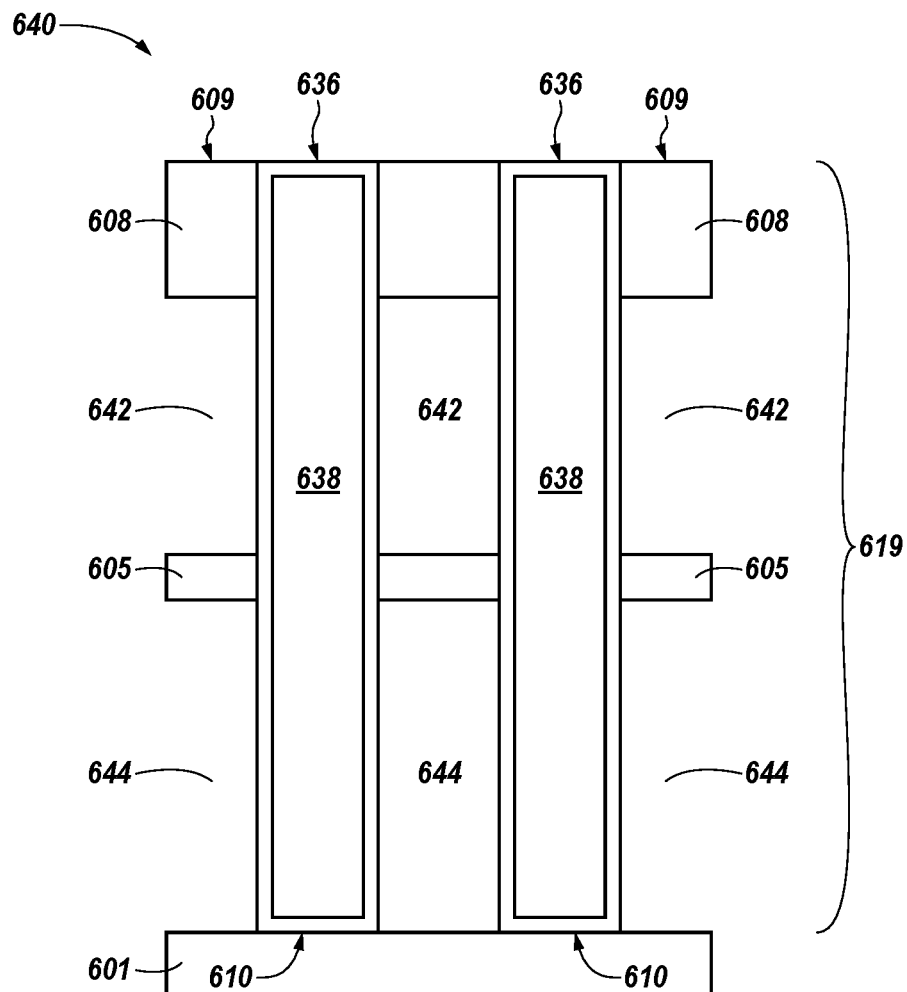

FIG. 6 illustrates a cross-sectional view of a portion of an example memory device at a point 640 in time in the example fabrication sequence for formation of a capacitor in accordance with a number of embodiments of the present disclosure. FIG. 6 illustrates a structure of the portion of the example memory device at a point 640 in time following completion of the example fabrication sequence described in connection with FIGS. 1-5.

As shown at point 640 in time, the first silicate material (e.g., BPSG) shown at 503 in FIG. 5 and the second silicate material (e.g., TEOS) shown at 506 in FIG. 5 have been removed from the portion of the example memory device shown in FIG. 6. The first silicate material 503 and the second silicate material 506 may be removed with (via application of) a solvent that is selective for removing (e.g., dissolving) the first and second silicate materials from the memory device while not removing (e.g., leaving) other materials such that those materials remain in the memory device. Such a selective solvent may be selected from water ($H_2O$), methanol ($CH_3OH$), ethanol ($C_2H_5OH$), isomers of propanol ($C_3H_7OH$) such as n-propanol and isopropanol, n-butanol ($C_4H_9OH$), among other possible alcohols, and sulfuric acid ($H_2SO_4$), and combinations thereof, among other possibilities. Removal of the first silicate material 503 and the second silicate material 506 may leave empty spaces (e.g., voids) 644 in the structure of the memory device.

In contrast, the application of the selective solvent may leave the capacitor material 638 having the first electrode material 636 formed on an outer surface thereof remaining in the structure of the memory device. In addition, the first nitride material 605 and the second nitride material 608 may be left remaining following the application of the selective solvent, among other possible components or structural features that may remain in the structure of the memory device. The remaining first nitride material 605 and the remaining second nitride material 608 may function as a capacitor support structure, as described further in connection with FIG. 7, to provide support in view of the voids 644 in the structure of the memory device.

At some time in association with the points 535 and 640, a portion of the capacitor material 638 in openings 519-1 and 519-2, along with the first electrode material 636 on an upper surface 609 of the second nitride material 608, may have been removed (e.g., etched). More of the first electrode material 636 may have been formed (e.g., deposited) on upper surfaces of remaining portions of the capacitor material 638 in the openings 519-1 and 519-2 such that the capacitor material 638 is covered on all surfaces with the first electrode material 636. An upper surface of the first electrode material 636 may, in a number of embodiments, be coplanar with the upper surface 609 of the second nitride material 608 such that a height of the capacitor material 638 covered by the first electrode material 636 may be the same as the height of the original opening 619.

Figure 7:
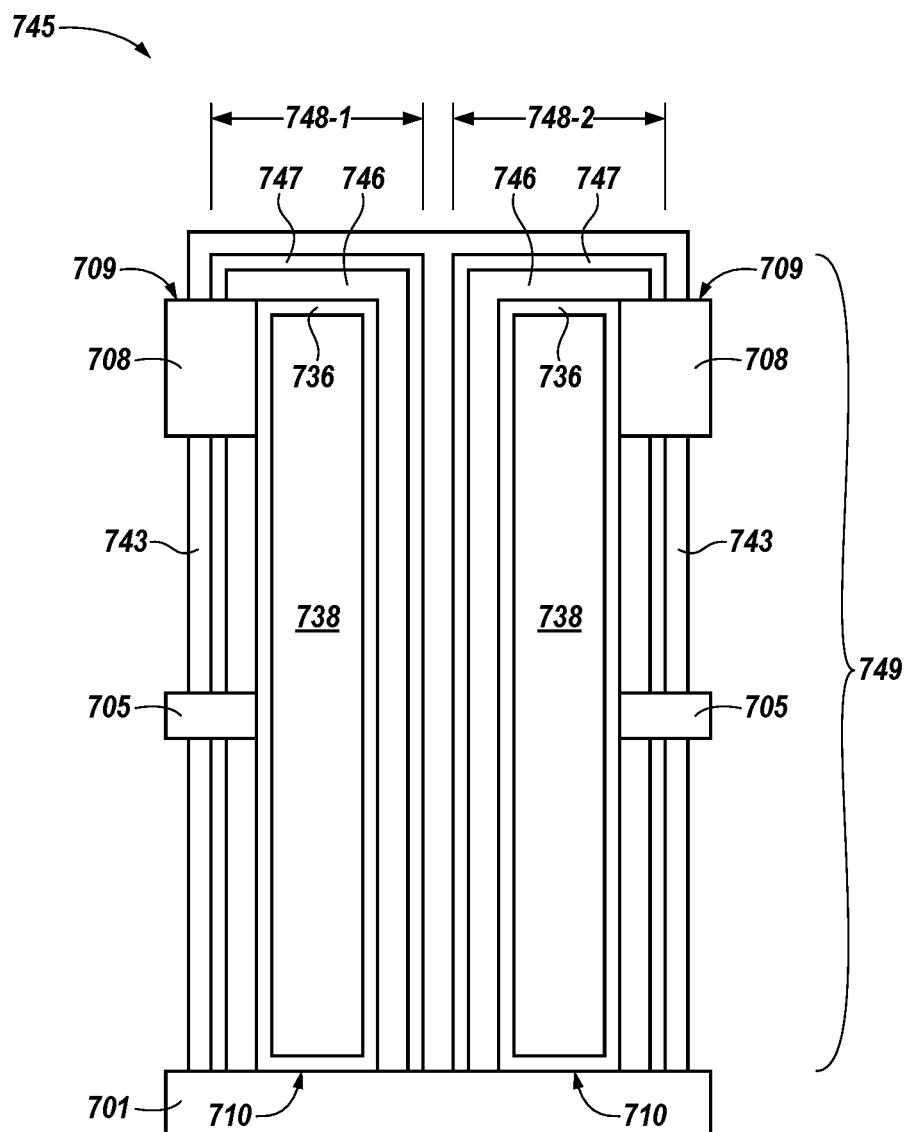

FIG. 7 illustrates a cross-sectional view of a portion of an example memory device at a point 745 in time in the example fabrication sequence for formation of a capacitor in accordance with a number of embodiments of the present disclosure. FIG. 7 illustrates a structure of the portion of the example memory device at a point 745 in time following completion of the example fabrication sequence described in connection with FIGS. 1-6.

As shown at point 745 in time, a dielectric material 746 has been formed (e.g., deposited) on an outer surface of the first electrode material 736. The dielectric material 746 may, in a number of embodiments, be formed from a surface 710 of the substrate material 701 to cover the outer surface, including an upper surface, of the first electrode material 736. A capacitor 748 may be subsequently formed, at least in part, by formation (e.g., deposition) of a second electrode material 747 on an outer surface of the dielectric material 746.

The portion of the example memory device illustrated in FIG. 7 shows a first capacitor 748-1 and a second capacitor 748-2 indicated as widths in the structure and formed as just described. A height 749 of the capacitors 748-1, 748-2 may be higher than the height of the original opening 619 due to the dielectric material 746 and second electrode material 747 being formed over the first electrode material 736. The example memory device illustrated in FIG. 7 shows a buffer material 743 that may be formed around and between the first and second capacitors 748-1, 748-2 as electrical insulation. The dielectric material 746, the second electrode material 747, and the buffer material 743 may be formed from any respective dielectric materials, conductive materials, and resistive materials and to any width (e.g., thickness) usable in association with formation of an operable capacitor for a semiconductor device.

The support structure is formed from the first nitride material 705 and the second nitride material 708, in addition to the underlying substrate material 701. The support structure may provide support to the first and second capacitors 748-1, 748-2 after the removal of the first and second silicate materials 503, 506 has left voids 644 in the structure of the memory device and even after such voids 644 may have been at least partially filled by the buffer material 743. The support structure formed from the first and second nitride materials 705, 708 is shown for simplicity to be attached only to the left side of the first electrode material 736 for capacitor 748-1 and the right side of the first electrode material 736 for capacitor 748-2. However, the support structure formed from the first and second nitride materials 705, 708 also may be on the opposite sides of (e.g., as shown in FIGS. 5-6), or may be attached at four position or even surround, the first and second capacitors 748-1, 748-2. In a number of embodiments, the dielectric material 746, the second electrode material 747, and/or the buffer material 743 may surround the first electrode material 736 of the capacitors 748-1, 748-2 except at defined positions where the first and second nitride materials 705, 708 of the support structure are attached to the first electrode material 736.

Formation of the capacitors and a capacitor support structure as just described may enable each of the capacitors to be maintained in a static configuration (e.g., relative to each other and the underlying material). For example, the capacitor support structure may reduce (e.g., prevent) a possibility of a capacitor bending and/or twisting during fabrication or use. The reduction in bending and/or twisting of the capacitors may reduce a possibility of unintended consequences, such as operational failure of the semiconductor device, need to replace parts, etc.

Formation of the capacitors and capacitor support structure as just described may be utilized in fabrication of a memory device that includes at least one memory cell. Such a memory cell may include at least one such capacitor, as a data storage element, that is supported by the capacitor support structure. The memory cell also may include at least one access device (e.g., transistor) (not shown) that is, or may be, coupled to the at least one capacitor.

FIG. 8 is a flow diagram of an example method 850 for reduction of roughness on a sidewall of an opening in accordance with a number of embodiments of the present disclosure. Unless explicitly stated, elements of methods described herein are not constrained to a particular order or sequence. Additionally, a number of the method embodiments, or elements thereof, described herein may be performed at the same, or at substantially the same, point in time.

At block 852, the method 850 may include forming a liner material on a first sidewall of an opening in a first silicate material and on a second sidewall of the opening in an overlying second silicate material (e.g., as described in connection with FIG. 2). The liner material may be formed to a thickness that covers a roughness on the first sidewall extending into the opening. At block 854, the method 850 may include removing the liner material from the first sidewall of the opening and the second sidewall of the opening with a non-selective etch chemistry to reduce (e.g., remove) the roughness on the first sidewall (e.g., as described in connection with FIGS. 3 and 4).

The method 850 may, in a number of embodiments, further include, prior to forming the liner material, forming the opening in the first silicate material to conform to a width of the opening previously formed in the overlying second silicate material, where the opening extends through the second silicate material and into the first silicate material (e.g., as described in connection with FIG. 1). The method 850 may further include forming the opening in a substantially cylindrical configuration that extends through the second silicate material and into the first silicate material (e.g., as described in connection with FIG. 1).

The method 850 may further include forming the first and second silicate materials from different silicate materials (e.g., as described in connection with FIG. 1). The method 850 may further include, prior to forming the liner material, removing a taper of the opening in the first silicate material to conform to a diameter of the opening previously formed in the overlying second silicate material (e.g., as described in connection with FIG. 1). The roughness may result from a selectivity for removal of a chemical compound of a plurality of chemical compounds that form the first silicate material (e.g., as described in connection with FIG. 1). The method 850 may further include determining the thickness of the liner material to form on the first and second sidewalls of the opening to cover the roughness based on a determination of a probable distance that the roughness extends into the opening (e.g., as described in connection with FIG. 2).

FIG. 9 is a flow diagram of another example method 960 for reduction of roughness on a sidewall of an opening in accordance with a number of embodiments of the present disclosure.

At block 962, the method 960 may include depositing a liner material on a first sidewall of an opening in a first silicate material adjacent an underlying material and on a second sidewall of the opening in an overlying second silicate material to a thickness that covers a roughness on the first sidewall extending into the opening (e.g., as described in connection with FIG. 2). At block 962, the method 960 may include etching the liner material and the roughness on the first sidewall utilizing a non-selective etch chemistry, until the liner material is removed from the first and second sidewalls of the opening, to reduce (e.g., remove) the roughness on the first sidewall (e.g., as described in connection with FIGS. 3 and 4).

The method 960 may, in a number of embodiments, further include forming the opening in a substantially cylindrical configuration that extends through the second silicate material and into the first silicate material (e.g., as described in connection with FIG. 1). The method 960 may further include, prior to depositing the liner material, etching a taper of the opening in the first silicate material to conform to a diameter of the opening formed in the overlying second silicate material (e.g., as described in connection with FIG. 1). The taper may have a diameter that decreases as the taper progresses toward the underlying material. The roughness may result from an etch selectivity for a chemical compound of a plurality of chemical compounds that form the first silicate material (e.g., as described in connection with FIG. 1).

Figure 10:
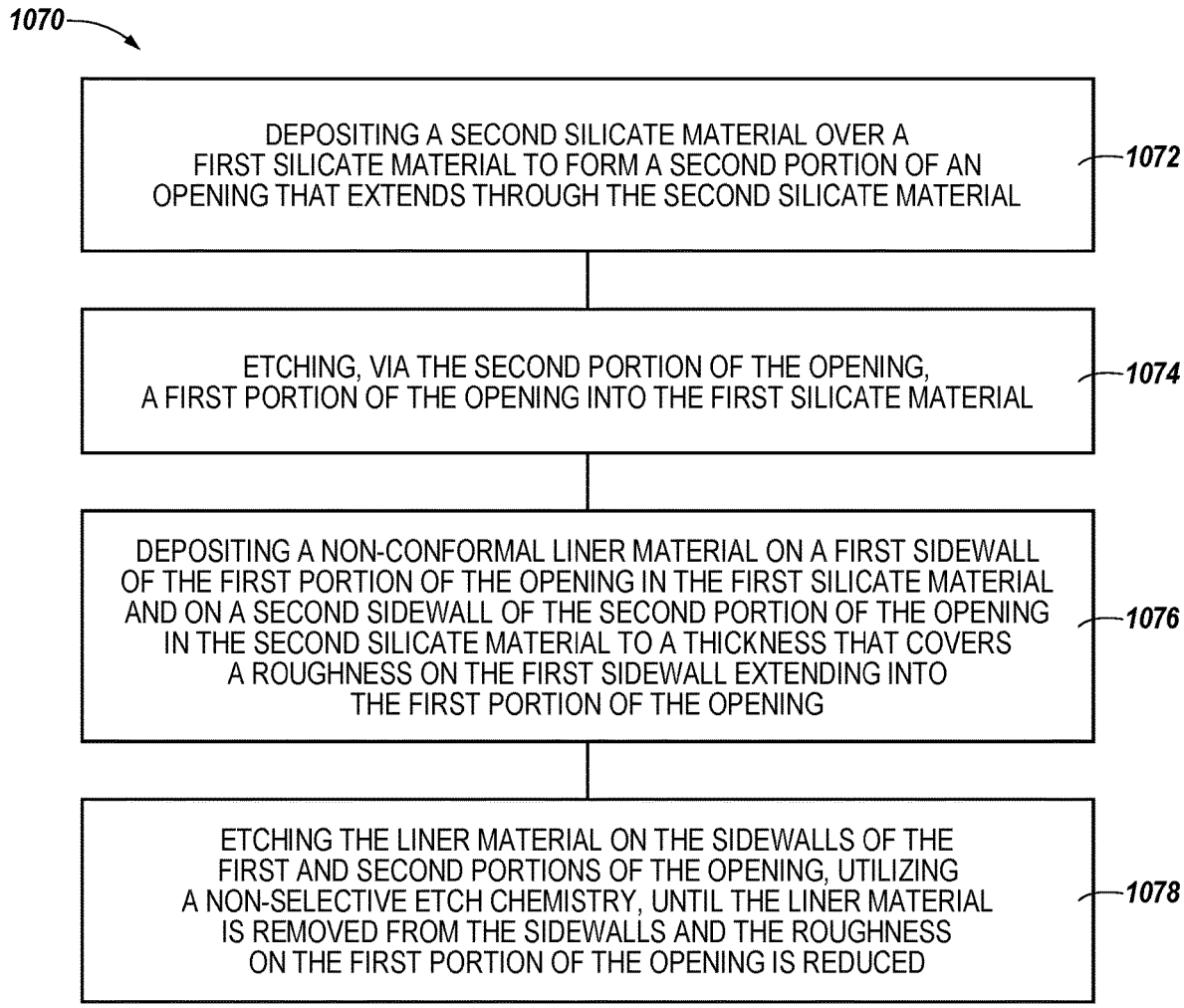

FIG. 10 is a flow diagram of another example method 1070 for reduction of roughness on a sidewall of an opening in accordance with a number of embodiments of the present disclosure.

At block 1072, the method 1070 may include depositing a second silicate material over a first silicate material to form a second portion of an opening that extends through the second silicate material (e.g., as described in connection with FIG. 1). At block 1074, the method 1070 may include etching, via (e.g., through) the second portion of the opening, a first portion of the opening into the first silicate material (e.g., as described in connection with FIG. 1). At block 1076, the method 1070 may include depositing a non-conformal liner material on a first sidewall of the first portion of the opening in the first silicate material and on a second sidewall of the second portion of the opening in the second silicate material to a thickness that covers a roughness on the first sidewall extending into the first portion of the opening (e.g., as described in connection with FIG. 2). At block 1078, the method 1070 may include etching the liner material on the sidewalls of the first and the second portions of the opening, utilizing a non-selective etch chemistry, until the liner material is removed from the sidewalls and the roughness on the first portion of the opening is reduced (e.g., removed) (e.g., as described in connection with FIGS. 3 and 4).

The method 1070 may, in a number of embodiments, further include depositing a first nitride material between the first silicate material and the second silicate material and depositing a second nitride material on a first surface of the second silicate material opposite from a second surface on which the first nitride material is formed (e.g., as described in connection with FIG. 1). The opening may extend from the substrate material and may include a sidewall formed from (e.g., through) the first silicate material, the first nitride material, the second silicate material, and the second nitride material (e.g., as described in connection with FIG. 1).

In the above detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. Moreover, the structural features illustrated in the accompanying drawings are intended to indicate relative positioning of the structural features in one or more embodiments and are not necessarily drawn to scale relative to other structural features in the drawings or otherwise.

It is to be understood that the terminology used herein is for the purpose of describing particular embodiments only and is not intended to be limiting. As used herein, the singular forms "a", "an", and "the" include singular and plural referents, unless the context clearly dictates otherwise, as do "a number of", "at least one", and "one or more" (e.g., a number of memory arrays may refer to one or more memory arrays), whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to". The terms "coupled" and "coupling" mean to be directly or indirectly connected physically and, unless stated otherwise, can include a wireless connection for access to and/or for movement (transmission) of instructions (e.g., control signals, address signals, etc.) and data, as appropriate to the context.

While example embodiments including various combinations and configurations of semiconductor materials, underlying materials, structural materials, dielectric materials, capacitor materials, substrate materials, silicate materials, nitride materials, buffer materials, etch chemistries, etch processes, solvents, memory devices, memory cells, sidewalls of openings and/or trenches, among other materials and/or components related to reduction of roughness on a sidewall of an opening, have been illustrated and described herein, embodiments of the present disclosure are not limited to those combinations explicitly recited herein. Other combinations and configurations of the semiconductor materials, underlying materials, structural materials, dielectric materials, capacitor materials, substrate materials, silicate materials, nitride materials, buffer materials, etch chemistries, etch processes, solvents, memory devices, memory cells, sidewalls of openings and/or trenches related to reduction of roughness on a sidewall of an opening than those disclosed herein are expressly included within the scope of this disclosure.

Although specific embodiments have been illustrated and described herein, those of ordinary skill in the art will appreciate that an arrangement calculated to achieve the same results may be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
   forming a first silicate material on a substrate material;
   forming an overlying second silicate material on the first silicate material, wherein the first silicate material is different from the second silicate material;
   forming an opening through the first and the second silicate materials to conform to a width of the opening formed in the overlying second silicate material, wherein forming the opening comprises using a selective etch process having a selectivity for removal of a compound that forms the first silicate material on an exposed surface of a first sidewall of the opening in the first silicate material, and wherein the opening extends through the overlying second silicate material and through the first silicate material;
   forming a liner material consisting of a same material as the first silicate material on the first sidewall of the opening in the first silicate material and on a second sidewall of the opening in the overlying second silicate material, wherein the liner material is formed to a thickness that covers a roughness on the first sidewall extending into the opening, and the roughness is caused by the selective etch process; extending into the opening; and removing portions of the liner material from the first sidewall of the opening and the second sidewall of the opening with a non-selective etch chemistry having a same etch rate for the liner material as the roughness to remove the roughness on the first sidewall caused by the selective etch process.

2. The method of claim 1, further comprising:

forming the opening in a substantially cylindrical configuration that extends through the overlying second silicate material and into the first silicate material; and prior to forming the liner material, removing a taper of the opening in the first silicate material to conform to a diameter of the opening previously formed in the overlying second silicate material;

wherein the roughness results from the selectivity for removal of a chemical compound of a plurality of chemical compounds that form the first silicate material.

3. The method of claim 1, further comprising determining the thickness of the liner material to form on the first and second sidewalls of the opening to cover the roughness based on a determination of a probable distance that the roughness extends into the opening.

4. A method, comprising:

forming a first silicate material on a substrate material;

forming an overlying second silicate material on the first silicate material, wherein the first silicate material is different from the second silicate material;

forming an opening through the first and second silicate materials to conform to a width of the opening formed in the overlying second silicate material, wherein forming the opening comprises using a selective etch process having a selectivity for removal of a compound that forms the first silicate material on an exposed surface of a first sidewall of the opening in the first silicate material, and wherein the opening extends through the overlying second silicate material and through the first silicate material;

depositing a liner material consisting of a same material as the first silicate material on the first sidewall of the opening in the first silicate material adjacent an underlying material and on a second sidewall of the opening in the overlying second silicate material to a thickness that covers a roughness on the first sidewall extending into the opening, and the roughness is caused by the selective etch process; and etching portions of the liner material and the roughness on the first sidewall utilizing a non-selective etch chemistry having a same etch rate for the liner material as the roughness, until portions of the liner material is removed from the first and second sidewalls of the opening and the roughness on the first sidewall caused by the selective etch process is removed.

5. The method of claim 4, further comprising:

forming the opening in a substantially cylindrical configuration that extends through the overlying second silicate material and into the first silicate material; and prior to depositing the liner material, etching a taper of the opening in the first silicate material, the taper having a diameter decreasing toward the underlying material, to conform to a diameter of the opening formed in the overlying second silicate material;

wherein the roughness results from an etch selectivity for a chemical compound of a plurality of chemical compounds that form the first silicate material.

6. The method of claim 4, further comprising:

forming the first silicate material from a borophosphosilicate glass (BPSG) material including a silicon compound ($SiO_2$) doped with a boron compound ($B_2O_3$) and a phosphorus compound ($P_2O_5$);

forming the overlying second silicate material from a tetraethyl orthosilicate (TEOS) material; and etching the liner material and the roughness on the first silicate material utilizing an etch chemistry that is non-selective to the liner material, the TEOS material, and the compounds of the BPSG material.

7. The method of claim 4, wherein depositing the liner material comprises depositing a non-conformal liner, such that it does not follow a contour of the roughness, on the first sidewall of the opening in the first silicate material to cover the roughness on the first sidewall.

8. The method of claim 4, further comprising utilizing a hydrogen fluoride (HF) based etch chemistry as the non-selective etch chemistry.

9. The method of claim 4, further comprising:

forming a support structure for the overlaying second silicate material stacked on the first silicate material adjacent the substrate material by:

forming a first nitride material between the first silicate material and the overlaying second silicate material; and forming a second nitride material on an opposite surface of the overlaying second silicate material;

wherein the support structure enables a stack of the first and the overlaying second silicate materials to be maintained in a static configuration relative to each other and the underlying material.

10. The method of claim 4, further comprising:

forming the opening in the first silicate material to extend from the underlying first silicate material and through the overlying second silicate material;

wherein the opening has:

a height in a range of from 800 nanometers (nm) to 1,500 nm;

a width in a range of from 20 nm to 60 nm; and an aspect ratio of the height to width in a range of from 25:1 to 50:1.

11. A method, comprising:

depositing an overlaying overlying second silicate material over a first silicate material and forming a second portion of an opening that extends through the overlying second silicate material, wherein the first silicate material is different from the second silicate material;

etching, via the second portion of the opening, a first portion of the opening into the first silicate material;

depositing a liner material on a first sidewall of the first portion of the opening in the first silicate material and on a second sidewall of the second portion of the opening in the overlying second silicate material to a thickness that covers a roughness on the first sidewall extending into the first portion of the opening, wherein the liner material is deposited such that is does not follow a contour of the roughness on a first side wall and the liner material consists of a same material as the first silicate material; and etching portions of the liner material on the sidewalls of the first and the second portions of the opening, utilizing a non-selective etch chemistry having a same etch rate for the liner material as the roughness, until portions of the liner material is removed from the sidewalls and the roughness on the first portion of the opening is removed.

12. The method of claim 11, further comprising:
depositing a first nitride material between the first silicate material and the overlaying second silicate material; and
depositing a second nitride material on a first surface of the overlaying second silicate material opposite from a second surface on which the first nitride material is formed;
wherein the opening extends from a substrate material and includes a sidewall formed from the first silicate material, the first nitride material, the overlaying second silicate material, and the second nitride material.

13. The method of claim 12, further comprising depositing a first electrode material on the substrate material and on the sidewall of the opening.

14. The method of claim 13, further comprising depositing a capacitor material to fill the opening from the substrate material to the second nitride material.

15. The method of claim 14, further comprising reducing a probability of a short circuit fault of a capacitor formed from the capacitor material by removal of the roughness on the first portion of the opening on which the first electrode material is formed.

16. The method of claim 14, further comprising:
removing, with a selective solvent, the first silicate material and the overlaying second silicate material;
leaving the capacitor material having the first electrode material formed on an outer surface thereof; and
leaving the first and second nitride materials as a capacitor support structure.

17. The method of claim 16, further comprising:
depositing a dielectric material on the first electrode material; and
forming a capacitor, at least in part, by deposition of a second electrode material on the dielectric material.

18. A portion of a memory device formed by the method of claim 17, wherein:
the memory device comprises at least one memory cell that includes:
at least one capacitor, as a data storage element, that is supported by the capacitor support structure; and
at least one access device coupled to the at least one capacitor.

* * * * *